(12) United States Patent
Kobayashi et al.

(10) Patent No.: US 8,038,824 B2
(45) Date of Patent: Oct. 18, 2011

(54) SHEET PEELING APPARATUS AND PEELING METHOD

(75) Inventors: Kenji Kobayashi, Tokyo (JP); Takahisa Yoshioka, Tokyo (JP); Takeshi Takano, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/060,925

(22) PCT Filed: Jul. 22, 2009

(86) PCT No.: PCT/JP2009/063099
§ 371 (c)(1),
(2), (4) Date: Feb. 25, 2011

(87) PCT Pub. No.: WO2010/024066
PCT Pub. Date: Mar. 4, 2010

(65) Prior Publication Data
US 2011/0155328 A1 Jun. 30, 2011

(30) Foreign Application Priority Data
Aug. 28, 2008 (JP) ................................. 2008-220399

(51) Int. Cl.
*B32B 38/10* (2006.01)
(52) U.S. Cl. ........ 156/247; 156/715; 156/764; 156/930; 156/941
(58) Field of Classification Search .................. 156/247, 156/714, 715, 759, 764, 930, 941
See application file for complete search history.

(56) References Cited

U.S. PATENT DOCUMENTS

| 5,006,189 A * | 4/1991 | Tsukamoto et al. .......... 156/247 |
| 6,296,034 B1 * | 10/2001 | Kodera et al. ................. 156/540 |
| 2003/0092288 A1 | 5/2003 | Yamamoto et al. |
| 2007/0235131 A1 | 10/2007 | Tsujimoto et al. |
| 2007/0284028 A1 | 12/2007 | Kawashima et al. |

FOREIGN PATENT DOCUMENTS

| JP | 2002-124494 A | 4/2002 |
| JP | 2003-022986 A | 1/2003 |
| JP | 2006-041160 A | 2/2006 |
| JP | 2007-173495 A | 7/2007 |
| JP | 2007-329315 A | 12/2007 |

OTHER PUBLICATIONS

International Search Report of PCT/JP2009/063099, date of mailing Aug. 18, 2009.

* cited by examiner

*Primary Examiner* — Mark A Osele
(74) *Attorney, Agent, or Firm* — Westerman, Hattori, Daniels & Adrian, LLP

(57) ABSTRACT

A sheet peeling apparatus 10 includes: a supporting means 11 for supporting a semiconductor wafer W stuck with an adhesive sheet S; a tape sticking means 14 for sticking a peeling tape T to the adhesive sheet S; a pulling means 13 for pulling the peeling tape T; a peeling assisting means 15 including an endless member 45 which is positioned on the adhesive sheet S, and wound on a guide member 41; and a sandwiching means 16 for sandwiching the adhesive sheet S between the endless member 45 and the sandwiching means 16. In the sheet peeling apparatus 10, the adhesive sheet S is peeled off due to the relative movement of the pulling means 13 and the supporting means 11 in a state that the adhesive sheet S is sandwiched between the peeling assisting means 15 and the sandwiching means 16.

6 Claims, 5 Drawing Sheets

SHEET PEELING APPARATUS AND PEELING METHOD

FIELD OF THE INVENTION

The present invention relates to a sheet peeling apparatus and peeling method, and in particular a sheet peeling apparatus and peeling method capable of imparting a peeling force while preventing damage to an adherend such as a semiconductor wafer when peeling off an adhesive sheet stuck on the adherend.

BACKGROUND OF THE ART

Conventionally, a semiconductor wafer (hereinafter, simply referred to as "wafer") is stuck with an adhesive sheet for protecting a circuit surface thereof. For example, the adhesive sheet is peeled off through a sheet peeling apparatus after a back grinding processing and the like of the wafer is carried out.

The above-mentioned peeling of the adhesive sheet can be performed, for example, using a sheet peeling apparatus disclosed in a patent document 1. The apparatus is configured to stick a peeling tape to an adhesive sheet stuck on a wafer, and when pulling the peeling tape, move the edge member and the wafer relative to each other while pressing an edge member having a tip formed in an acute angle against the adhesive sheet and pulling the peeling tape.

[Patent document 1] Japanese Patent Laid-Open No. 2002-124494

SUMMARY OF THE INVENTION

Problem to be Solved by the Invention

However, there is such a disadvantage that, in the peeling apparatus disclosed in patent document 1, the edge member is pressed against the adhesive sheet to prevent the wafer from floating up or to maintain a constant peeling angle, and therefore, the adhesive sheet is tightly sandwiched between the wafer and the edge member, thereby increasing the peeling resistance thereof, so that the peeling tape or the adhesive sheet is tore in the middle of peeling off the adhesive sheet, resulting in occurrence of a peeling defect.

Further, as shown in FIG. 5, although even when a peeling is performed using the edge member, an edge peeling can be realized in an adhesive sheet section on an extension along a peeling direction due to transmission of a tension force when pulling the peeling tape to peel off the adhesive sheet, but in the other adhesive sheet section located on tip side of the edge member, peeling delay E occurs due to stretch of the adhesive sheet. When such peeling delay E occurs, a folded edge of the adhesive sheet cannot be placed in close contact with the edge member, so that there arises such a disadvantage that the peeling effect in the edge member may not be sufficiently obtained.

Object of the Invention

The present invention has been proposed in view of the above disadvantages. It is an object of the present invention to provide a sheet peeling apparatus and peeling method capable of performing smooth peeling of the adhesive sheet by preventing a wafer from floating up without increasing the peeling resistance of an adhesive sheet.

Also, it is another object of the present invention to provide a sheet peeling apparatus and peeling method capable of peeling off an adhesive sheet while maintaining a folded edge, which is formed when peeling off the adhesive sheet, in close contact with a certain member.

Means for Solving Problems

In order to achieve the above object, the present invention adopts an arrangement in a sheet peeling apparatus that comprises: a supporting means for supporting an adherend stuck with an adhesive sheet; a tape sticking means for sticking a peeling tape to the adhesive sheet; a pulling means for pulling the peeling tape; and a peeling assisting means including an endless member wound on a guide member which is positioned on the adhesive sheet, and can rotationally travel in accordance with peeling-off operation of the adhesive sheet; in which the pulling means pulls a peeling sheet such that the peeling assisting means forms a folded edge in the adhesive sheet so that the adhesive sheet is peelably attached; and wherein the sheet peeling apparatus further comprises a sandwiching means that is disposed in a position facing the endless member, sandwiches the adhesive sheet between the endless member and the sandwiching means to maintain the folded edge in close contact with the endless member, and can rotationally travel or rotate with the peeling-off operation of the adhesive sheet.

The present invention may adopt such an arrangement that the guide member includes an edge member with a pointed section, and the folded edge of the adhesive sheet is formed by the pointed section of the edge member.

Also, the sandwiching means comprises a roller provided to be capable of moving closer to/away from the endless member.

Further, the sandwiching means may comprise a plurality of rollers provided to be capable of moving closer to/away from the endless member, and a sandwiching endless member wound around the rollers.

Furthermore, the sandwiching means may include a roller positioned on the outer periphery side of the endless member, and a platen positioned on the inner periphery side of the endless member.

Still further, the present invention adopts an method that includes sticking a peeling tape to an adhesive sheet stuck on an adherend, and pulling the peeling tape in a predetermined peeling direction to peel off the adhesive sheet from the adherend; the method comprising: bringing an endless member into contact with the adhesive sheet, the endless member being capable of rotationally traveling in accordance with peeling-off operation of the adhesive sheet; turning the adhesive sheet around in a peeling direction such that the adhesive sheet comes into contact with an outer surface of the endless member by pulling the peeling tape; and then, moving a sandwiching means, which is provided to be capable of moving closer to/away from the endless member, closer to the endless member, and sandwiching the adhesive sheet to peel off the adhesive sheet while maintaining a folded edge in close contact with the endless member.

Effect of the Invention

According to the present invention, there is adopted such an arrangement that the endless member constituting the peeling assisting means rotationally travels in accordance with peeling-off operation of the adhesive sheet, and the sandwiching means is moved toward the endless member to sandwich the adhesive sheet therebetween. Therefore, there is eliminated such a disadvantage that the adhesive sheet is tightly sandwiched between the peeling assisting means and the adherend. And, a smooth peeling of the adhesive sheet can be performed by preventing the wafer from floating up without increasing the peeling resistance of the adhesive sheet, and the folded edge of the adhesive sheet can be maintained in close contact with the endless member. Accordingly, the peeling effect in the edge member maintaining a constant peeling angle may be sufficiently obtained. Thus, the peeling defect of the adhesive sheet can be prevented before it occurs, and moreover, even in adherends having fragility, such as wafers, damage to such wafers can be prevented.

Also, by adopting the edge member having the pointed section, the peeling angle (an angle denoted by θ in FIG. 4(D)) can be increased, so that it is possible to perform the peeling while more effectively preventing the adherend from floating up.

Further, by using the roller or the sandwiching endless member wound on the plurality of rollers as the sandwiching means, it is possible to pass the adhesive sheet therethrough while minimizing the resistance between the sandwiching means and the peeling assisting means.

Furthermore, in the case of the platen being positioned on the inner periphery side of the endless member, a rotational traveling path of the endless member can be maintained in a certain position.

EXPLANATION OF REFERENCE NUMERALS

Figure 1:
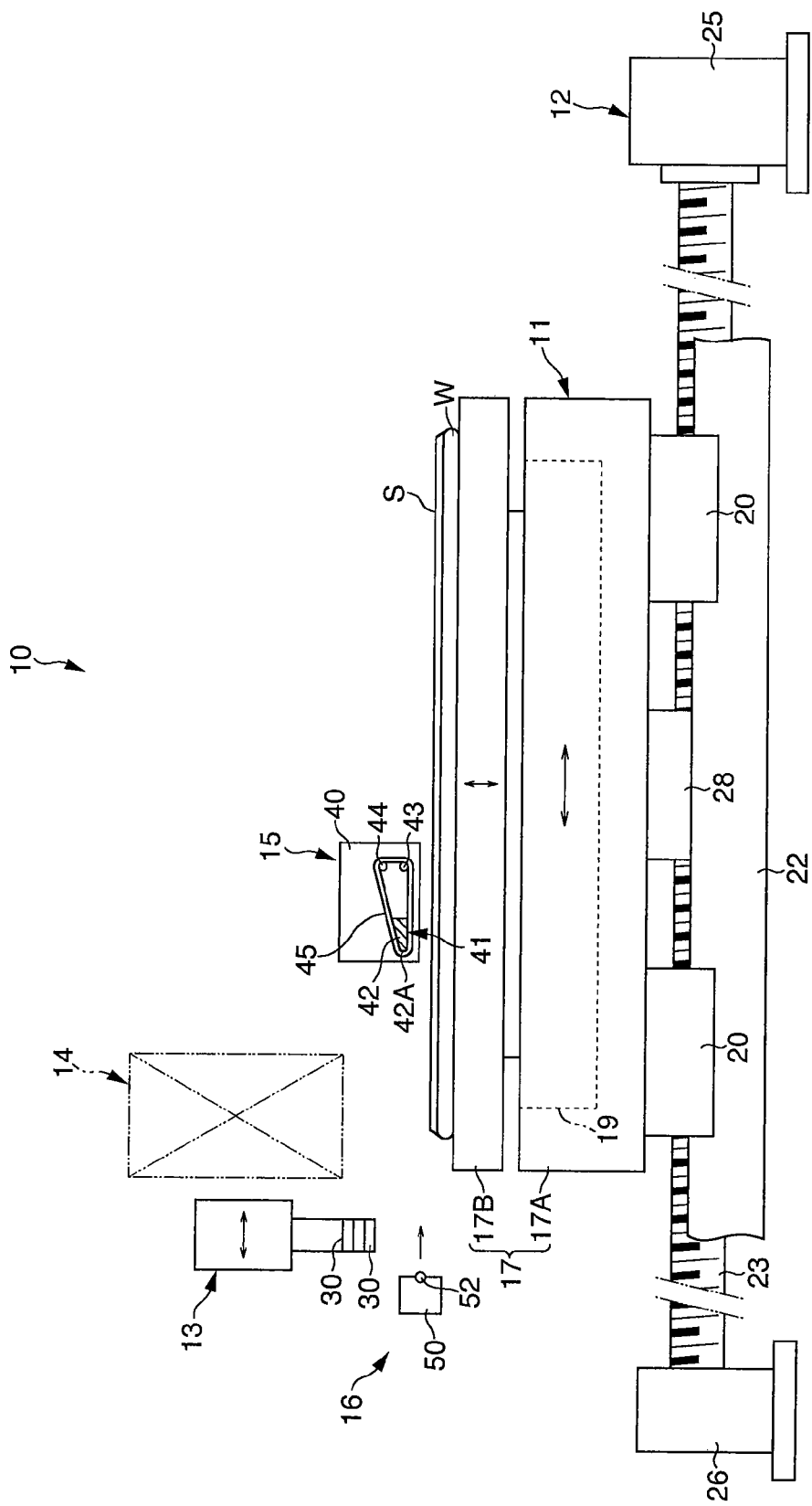
FIG. 1 is a schematic front view of a sheet peeling apparatus according to this embodiment.

10: sheet peeling apparatus
11: supporting means
12: moving means
13: peeling head (pulling means)
14: tape supply unit (tape sticking means)
15: peeling assisting means
16: sandwiching means
41: guide member
42: edge member
42A: pointed section
43, 44, 52, 62, 65, and 66: roller
45: endless member
60: sandwiching endless member
64: platen
B: folded edge
T: peeling tape
S: adhesive sheet
W: semiconductor wafer (adherend)

DESCRIPTION OF THE PREFERRED EMBODIMENTS

Hereinafter, an embodiment of the present invention is described with reference to the drawings.

Figure 2:
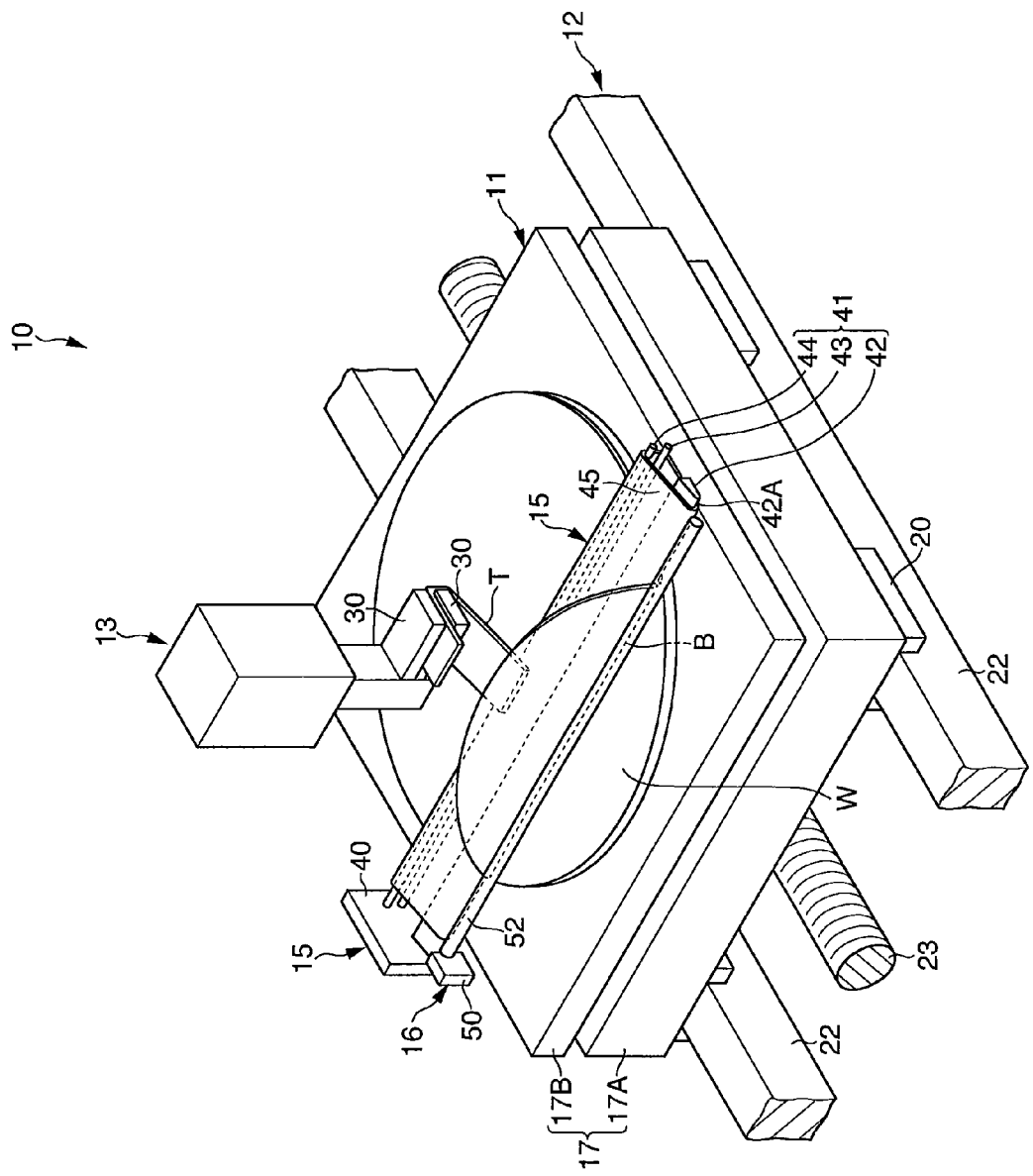
FIG. 2 is a schematic perspective view showing the sheet peeling apparatus in operation.

FIG. 1 is a schematic front view of a sheet peeling apparatus according to this embodiment; and FIG. 2 is a schematic perspective view of the sheet peeling apparatus in peeling-off operation. In these figures, a sheet peeling apparatus 10 comprises: a supporting means 11 for supporting a wafer W as an adherend stuck with an adhesive sheet S on a front surface (circuit surface), that is, on the upper side surface; a moving means 12 for movably supporting the supporting means 11; a peeling head 13 as a pulling means which sticks a peeling tape T (see FIG. 2) to the adhesive sheet S and pulls the peeling tape T in a direction of peeling off the adhesive sheet S from the wafer W; a tape supply unit 14 constitutes a tape sticking means which feeds out the peeling tape T and sticks the peeling tape T to the adhesive sheet S; a peeling assisting means 15 positioned between the supporting means 11 and the peeling head 13, and forming a folded edge B of the adhesive sheet S (see FIG. 2); and a sandwiching means 16 for sandwiching the adhesive sheet S between the peeling assisting means 15 and the sandwiching means 16.

The supporting means 11 comprises, but is not particularly limited to, a table 17 including a lower table 17A and an upper table 17B that have a square shape when viewed in a plan view; a driving device 19 disposed between the lower table 17A and the upper table 17B, and can rotate, and can elevate and lower the upper table 17B; and a slider 20 provided on the lower surface side of the lower table 17A. Here, in the upper table 17B, an upper surface thereof is formed as a suction surface (not shown), which is configured to be capable of sucking and holding the wafer W.

The moving means 12 comprises a pair of guide rails 22; a feed screw shaft 23 extending parallel to the guide rails 22 between the guide rails 22; and a drive motor 25 that is positioned at one end side of the feed screw shaft 23 and rotates the feed screw shaft 23; and a bearing 26 for supporting the other end side of the feed screw shaft 23. The supporting means 11 is movably supported on the guide rails 22 through the slider 20, and the feed screw shaft 23 engages with a nut member 28 in a state that the feed screw shaft 23 passes through the nut member 28 provided on the lower surface side of the lower table 17A. Rotation of the feed screw shaft 23 enables the supporting means 11 to move along the guide rails 22.

The peeling head 13 comprises upper and lower pair of chuck claws 30 in a lower portion thereof, which are provided to be capable of moving closer to/away from each other in a vertical direction. The peeling head 13 is configured such that the peeling tape T can be nipped between the chuck claws 30 to be able to hold the peeling tape T. The peeling head 13 is supported by the tape supply unit 14 via a supporting member (not shown) and the like. The peeling head 13 may adopt the same arrangement as a peeling head described in a prior application (Japanese Patent Laid-Open No. 2003-22986) filed by this applicant.

The tape supply unit 14, which is the same as a unit disclosed in the publication of the above prior application, includes: a tape feed-out section for feeding out the peeling tape T to the peeling head 13; a heater for heat welding the peeling tape T to the adhesive sheet S; a cutter for cutting the peeling tape T at each predetermined length thereof; and the like. The tape supply unit 14 is not the main subject matter of the present application, and therefore a description about a detailed structure of each part thereof is omitted herein.

The peeling assisting means 15 comprises: a supporting block 40 provided movably in a left and right direction in FIG. 1 through a moving device (not shown) positioned lateral to the upper table 17B; and a single endless member 45, such as a rubber belt, that is provided on the outer periphery side of a guide member 41 supported by the supporting block 40, and performs the rotational traveling operation, i.e. rotates in accordance with the peeling-off operation of the adhesive sheet S. The guide member 41 includes an edge member 42 with a pointed section 42A, and a first and a second rollers 43 and 44 provided in conjunction with the edge member 42. The edge member 42 has an acute triangle shape in cross-sectional shape such that an angle on the left side in the FIG. 1 and the endless member 45 form the folded edge B of the adhesive sheet S (see FIG. 2). As shown in FIG. 2, the edge member 42, and the first and the second rollers 43 and 44 are designed to be longer than the width which is perpendicular to a peeling direction of the adhesive sheet S, and are disposed substantially parallel with each other in an axial direction thereof.

The endless member 45 is wound around the periphery sides of the edge member 42 and the first and the second rollers 43 and 44, and in such a state, a region between a lower surface of the edge member 42 and the first roller 43 is parallel to a surface of the adhesive sheet S, so that the endless member 45 is configured to rotationally travel by surface contact of such parallel region with the adhesive sheet S.

The sandwiching means 16 comprises a moving block 50 supported movably in a horizontal direction in FIG. 1 through a moving device (not shown), and a roller 52 rotatably supported by the moving block 50. After the peeling tape T is stuck on the adhesive sheet S, the moving block 50 moves to the peeling assisting means 15 side along with the peeling head 13, so that the adhesive sheet S can be sandwiched between the roller 52 and the endless member 45.

Next, a sheet peeling method in this embodiment is described with reference to FIG. 3.

First, a wafer W is placed on the upper table 17B through a transporting arm (not shown), and sucked and held. Then, the peeling tape T is fed out from the tape supply unit 14 through the chuck claws 30, a portion of the peeling tape T being welded to the adhesive sheet S and cut at a predetermined position (see dashed-two dotted lines in FIG. 3). Note that adhering the peeling tape T is the substantially same as an operation described in the publication of the above prior application.

Figure 3:
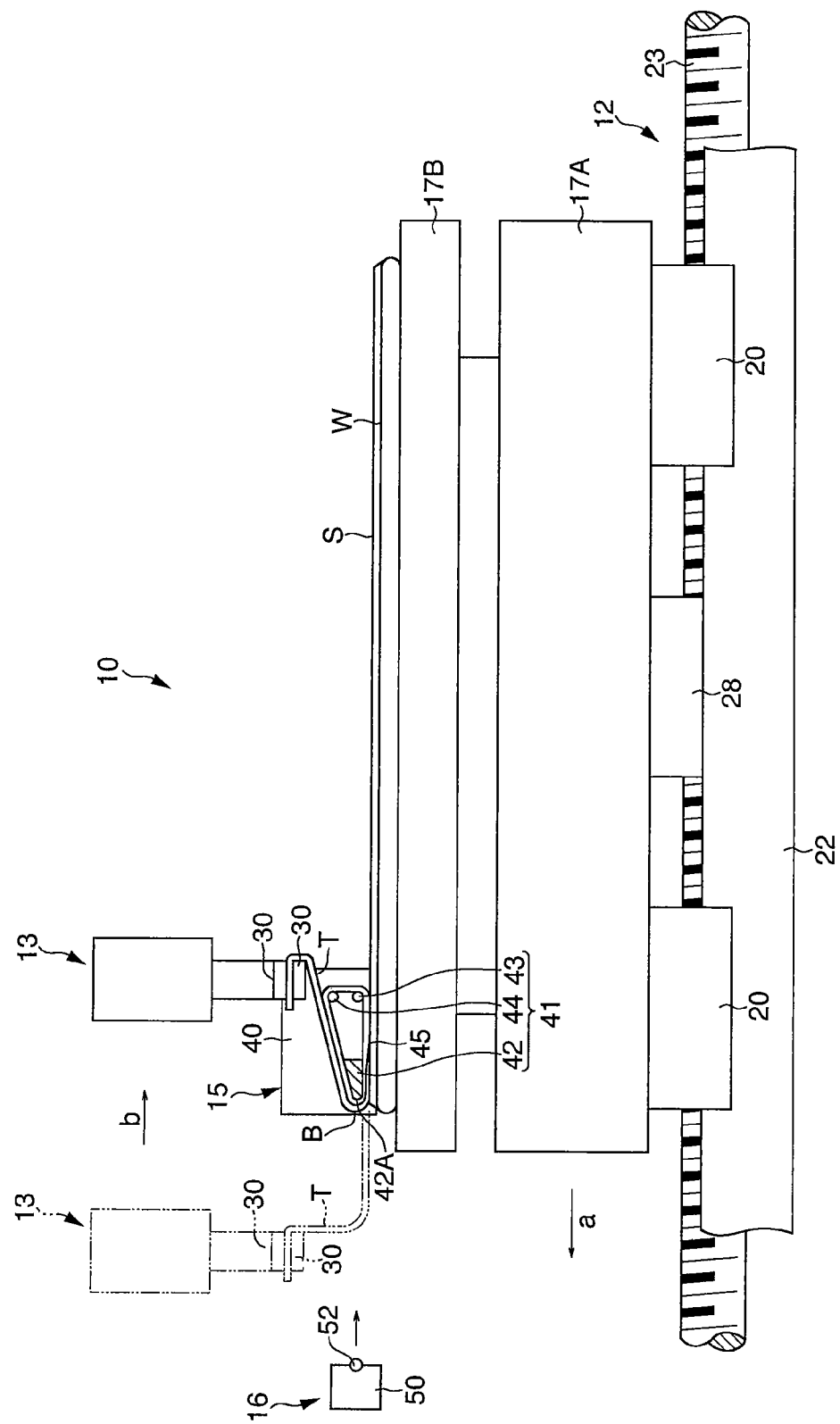
FIG. 3 is a schematic front view showing a state of a pulling means that has moved from an initial position to a peeling start position.

Then, the upper table 17B is lifted up through the driving device 19, and the peeling assisting means 15 moves to a position shown in FIG. 3 through the moving device (not shown), and the endless member 45 on the tip side of the edge member 42 is positioned, on the adhesive sheet S, on the outer peripheral edge side thereof. Then, the peeling head 13 moves from a position as shown by dashed-two dotted lines to a position as shown by a solid line, so that the folded edge B is formed when peeling off the adhesive sheet S. Concurrently, the sandwiching means 16 moves to the peeling assisting means 15 side, so that the peeling tape T become sandwiched between the roller 52 and the endless member 45. In this state, the supporting means 11 starts to move in a direction of an arrow "a" in FIG. 3 through the moving means 12, and on the other hand, the peeling head 13 relatively moves in a direction of an arrow "b" at the same speed as the moving means 12.

Figure 5:
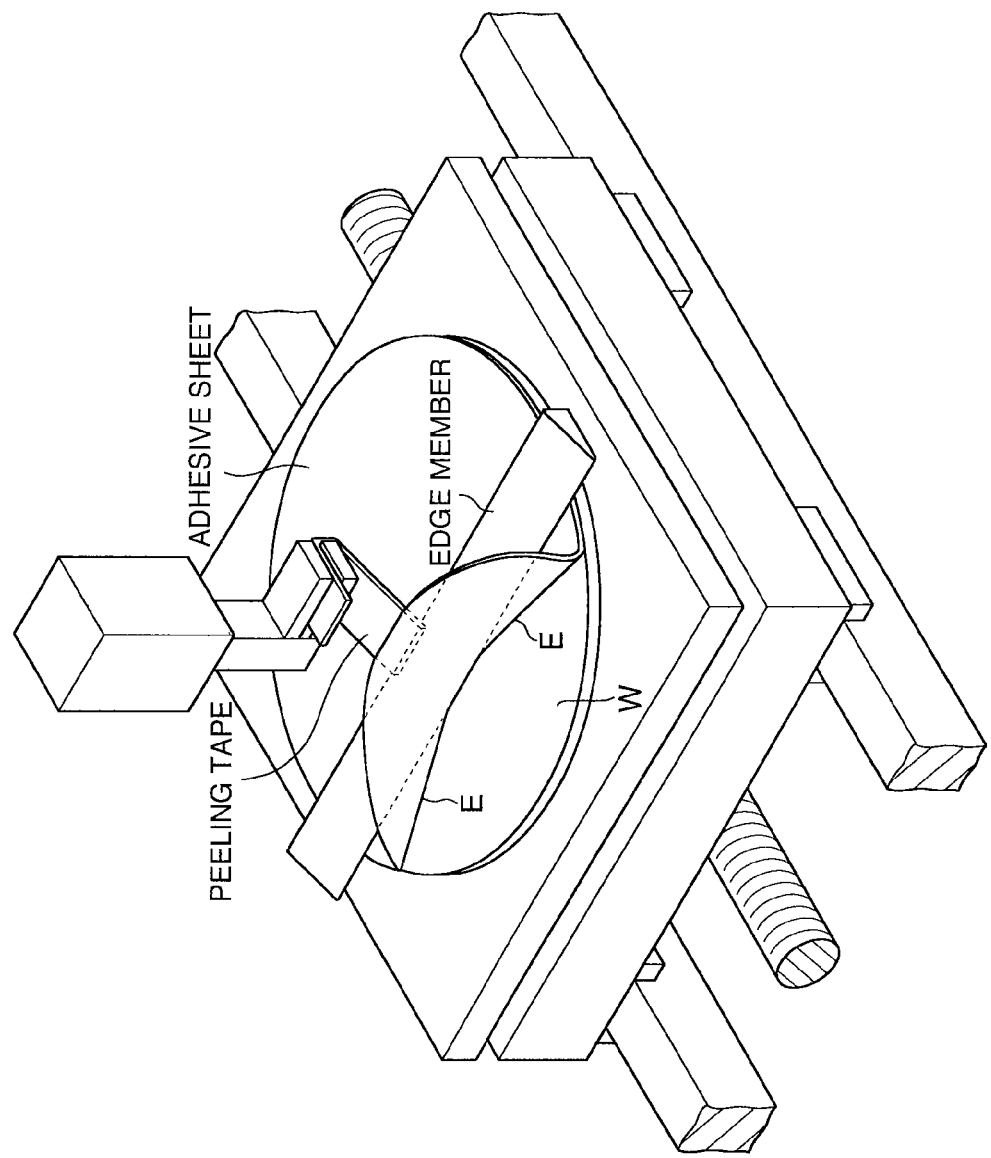
FIG. 5 is a schematic perspective view showing an example of a defect.

In this way, the peeling of the adhesive sheet S proceeds, while the folded edge B of the adhesive sheet S is maintained on the pointed section 42A side of the edge member 42, due to the relative movement of the supporting means 11 and the peeling head 13. In this peeling-off operation, the endless member 45 rotates in a clockwise direction in FIG. 3 due to the contact of the endless member 45 with an upper surface of the adhesive sheet S. Therefore, it is avoided for the peeling tape T or the adhesive sheet S to be tore due to the fact that the adhesive sheet S is tightly sandwiched between the wafer W and the peeling assisting means 15, as in a conventional case, and smooth peeling-off operation of the adhesive sheet S can surely prevent a peeling defect. Moreover, the folded edge B of the adhesive sheet S is always maintained in close contact with the endless member 45 since the roller 52 acts to press toward the peeling assisting means 15 side, and there does not arise such a disadvantage that the adhesive sheet S positioned on the tip side of the edge member 42 is stretched to generate peeling delay E as shown in FIG. 5.

Note that the upper table 17B can perform a head-swinging motion in a plane through the driving device 19 if desired. Due to this, the adhesive sheet S is gradually peeled off from the wafer W in such a way that the adhesive sheet S is taken up in a zigzag manner. Then, the peeling of the adhesive sheet S is completed when the supporting means 11 passes through the location of a lower portion of the peeling assisting means 15.

In this way, after the adhesive sheet S has been completely peeled off from the wafer W, the wafer W is transported through the transporting arm (not shown). On the other hand, the peeled adhesive sheet S is discarded together with the peeling tape T into a waste box or the like (not shown). Then, when the supporting means 11, the peeling head 13, the peeling assisting means 15, and the sandwiching means 16 return to an initial position, a wafer W which is a new object to be peeled off is transferred onto the upper table 17B, and thereafter an adhesive sheet S will be peeled off likewise.

Therefore, according to such an embodiment, even when the peeling assisting means 15 acts to press the adhesive sheet S against the wafer W side, the adhesive sheet S can be stably peeled off while reducing the peeling resistance since the endless member 45 performs the rotational traveling operation, so that damage to the wafer W can be effectively prevented when targeting at an object having fragility such as the wafer W. Moreover, since the sandwiching means 16 acts to sandwich the adhesive sheet S between the endless member 45 and the sandwiching means 16, the folded edge of the adhesive sheet S can be always placed in close contact with the endless member 45, thereby enabling the adhesive sheet S to be peeled off without generating peeling delay as in a conventional case.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to shape, location, layout and the like without departing from the technical spirit and the range of the object of the present invention.

Figure 4A:
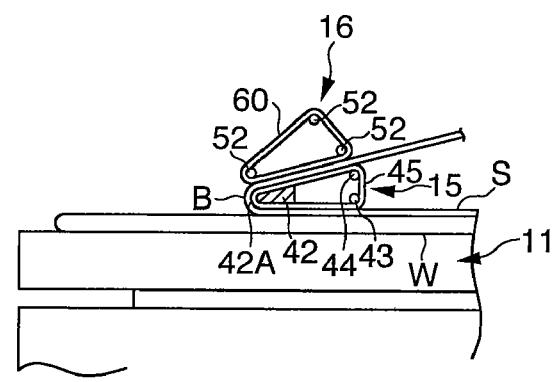
FIGS. 4(A) to 4(D) are schematic front views of main parts showing variations of a sandwiching means.
Figure 4B:
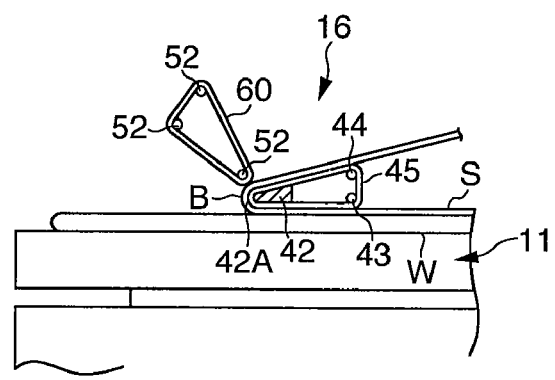

For example, in an embodiment, as shown in FIGS. 4(A) and 4(B), a plurality of rollers 52 may be provided, and a sandwiching endless member 60 similar to the endless member 45 may be provided to be capable of rotationally traveling around the rollers 52 to sandwich the adhesive sheet S between the sandwiching endless member 60 and the endless member 45 of the peeling assisting means 15, thereby maintaining a folded edge B in close contact with the endless member 45.

Figure 4C:
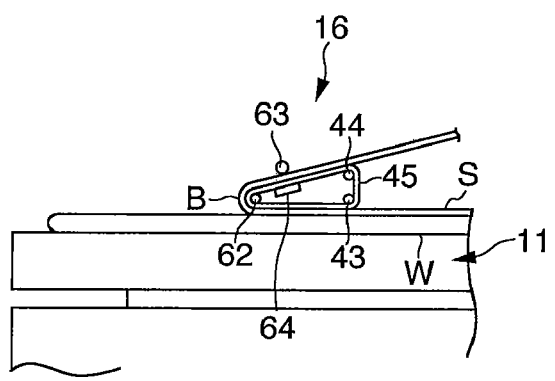

Also, as shown in FIG. 4(C), a roller 62 may be provided to be capable of forming a folded edge B, as an alternative to the above-mentioned edge member 42; and a roller 63 may be provided on the outer surface side of the endless member 45 between the roller 62 and the second roller 44, while a platen 64 may be provided on the inner surface side thereof to sandwich the adhesive sheet S.

Figure 4D:
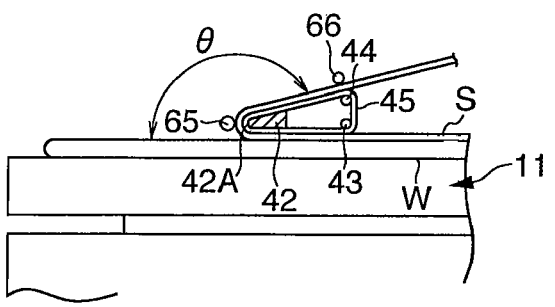

Further, as shown in FIG. 4(D), rollers 65, 66 may be configured to be disposed in positions relative to the pointed section 42A and the second roller 44, respectively, to sandwich the adhesive sheet S.

Furthermore, the endless member 45, the sandwiching endless member 60, and the rollers 63, 65 and 66 may be configured to be passively-rotated with peeling of the adhesive sheet S, or to be actively-rotated through a driving means or the like.

Still further, the endless member 45 is not limited to be composed of a single rubber belt, but may comprise a plurality of belts with the belts being wound spaced at a predetermined interval along a longitudinal direction of the guide member 41.

Also, adherends are not limited to semiconductor wafers W, but may also include glass plates, steel plates, ceramics, wooden boards, resin plates, or the like, and other adherends; and the semiconductor wafers may be silicon wafers or compound wafers.

Further, the endless member 45 and the sandwiching endless member 60 may be composed of resin belts, silicone belts, leather belts, metal belts, cloth belts, or the like, other than rubber belts.

Furthermore, the peeling tape T may adopt a heat-sensitive adhesive tape or a pressure-sensitive adhesive tape. Moreover, the peeling tape T may be arranged such that a strip-shaped tape, such as that described in Patent document 1, is stuck throughout a diameter of the adhesive sheet, other than the use by cutting it as in the above embodiment.

Still further, the peeling-off operation of the adhesive sheet S may be adapted such that, while one of the peeling head 13 or the table 17 is kept at rest, the peeling assisting means 15 is moved at a half speed of the peeling operation speed of the other in the same direction as the operating direction of peeling-off of the other.

What is claimed is:

1. A sheet peeling apparatus, comprising: a supporting means for supporting an adherend stuck with an adhesive sheet; a tape sticking means for sticking a peeling tape to the adhesive sheet; a pulling means for pulling the peeling tape; and a peeling assisting means including an endless member wound on a guide member which is positioned on the adhesive sheet, and can rotationally travel in accordance with peeling-off operation of the adhesive sheet; in which the pulling means pulls a peeling sheet such that the peeling assisting means forms a folded edge in the adhesive sheet so that the adhesive sheet is peelably attached; and wherein the sheet peeling apparatus further comprises a sandwiching means that is disposed in a position facing the endless member, sandwiches the adhesive sheet between the endless member and the sandwiching means to maintain the folded edge in close contact with the endless member, and can rotationally travel or rotate with the peeling-off operation of the adhesive sheet.

2. The sheet peeling apparatus according to claim 1, wherein the guide member includes an edge member with a pointed section, and the folded edge of the adhesive sheet is formed by the pointed section of the edge member.

3. The sheet peeling apparatus according to claim 1 or 2, wherein the sandwiching means comprises a roller provided to be capable of moving closer to/away from the endless member.

4. The sheet peeling apparatus according to claim 1 or 2, wherein the sandwiching means comprises a plurality of rollers provided to be capable of moving closer to/away from the endless member, and a sandwiching endless member wound around the rollers.

5. The sheet peeling apparatus according to claim 1 or 2, wherein the sandwiching means includes a roller positioned on the outer periphery side of the endless member, and a platen positioned on the inner periphery side of the endless member.

6. A sheet peeling method, including sticking a peeling tape to an adhesive sheet stuck on an adherend, and pulling the peeling tape in a predetermined peeling direction to peel off the adhesive sheet from the adherend; the method comprising:

bringing an endless member into contact with the adhesive sheet, the endless member being capable of rotationally traveling in accordance with peeling-off operation of the adhesive sheet;

turning the adhesive sheet around in a peeling direction such that the adhesive sheet comes into contact with an outer surface of the endless member by pulling the peeling tape; and then, moving a sandwiching means, which is provided to be capable of moving closer to/away from the endless member, closer to the endless member, and sandwiching the adhesive sheet to peel off the adhesive sheet while maintaining a folded edge in close contact with the endless member.

* * * * *